USOO9274294B2

(12) United States Patent
Tamura (10) Patent No.: US 9,274,294 B2
(45) Date of Patent: Mar. 1, 2016

(54) OPTICAL COMMUNICATION MODULE AND METHOD FOR PRODUCING THE SAME

(71) Applicant: Hitachi Metals, Ltd., Tokyo (JP)

(72) Inventor: Kenichi Tamura, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 14/550,843

(22) Filed: Nov. 21, 2014

(65) Prior Publication Data

US 2015/0346442 A1  Dec. 3, 2015

(30) Foreign Application Priority Data

May 28, 2014  (JP) ................................ 2014-110688

(51) Int. Cl.
*G02B 6/42* (2006.01)
*H01S 5/02* (2006.01)
*G02B 3/00* (2006.01)
*H01S 5/022* (2006.01)
*G02B 6/293* (2006.01)

(52) U.S. Cl.
CPC ............ *G02B 6/4244* (2013.01); *G02B 3/0075* (2013.01); *G02B 6/4204* (2013.01); *G02B 6/425* (2013.01); *G02B 6/4237* (2013.01); *G02B 6/4245* (2013.01); *H01S 5/02252* (2013.01); *H01S 5/02288* (2013.01); *G02B 6/2938* (2013.01)

(58) Field of Classification Search
CPC .... G02B 6/4244; G02B 6/425; G02B 6/4245; G02B 6/4237; H01S 5/02288
See application file for complete search history.

(56) References Cited

U.S. PATENT DOCUMENTS

| 5,793,792 A  * | 8/1998  | Baxter ................ H01S 5/02252 372/101 |
| 5,995,525 A  * | 11/1999 | Kosugi ................. G02B 6/4204 372/109 |
| 2004/0258124 A1* | 12/2004 | Lissotschenko .... H01S 5/02252 372/75 |
| 2013/0011104 A1 | 1/2013 | Sato |
| 2015/0117010 A1* | 4/2015 | Auen ................. G02B 19/0061 362/257 |
| 2015/0177474 A1* | 6/2015 | Tsuzuki ................... G02B 7/02 385/33 |

FOREIGN PATENT DOCUMENTS

JP  2013-080900 A  5/2013

\* cited by examiner

*Primary Examiner* — Jerry Rahll
(74) *Attorney, Agent, or Firm* — McGinn IP Law Group, PLLC (57) ABSTRACT

An optical communication module includes a plurality of semiconductor lasers that emit optical signals with different wavelengths, a plurality of first mounts each including a first mounting surface on which a corresponding one of the semiconductor lasers is mounted and a first side surface that intersects with the first mounting surface, a second mount including a second mounting surface on which a lens array that collimates an optical signal emitted from a corresponding one of the plurality of semiconductor lasers and a multiplexing optical system that multiplexes the plurality of optical signals that have been collimated by the lens array and a second side surface that intersects with the second mounting surface. Each of the first mounts is fixed to the second mount in a state where a corresponding one of the semiconductor lasers is aligned with the lens array and the first side surface abuts the second side surface.

6 Claims, 8 Drawing Sheets

OPTICAL COMMUNICATION MODULE AND METHOD FOR PRODUCING THE SAME

The present application is based on Japanese patent application No. 2014-110688 filed on May 28, 2014, the entire contents of which are incorporated herein by reference.

BACKGROUND OF THE INVENTION

1. Field of the Invention

The present invention relates to optical communication modules, and more particularly, relates to an optical communication module used for wavelength division multiplexing.

2. Description of the Related Art

In the field of optical communications, the transmission capacity per optical fiber cable has been increasing, and wavelength division multiplexing (WDM) as a communication method which realizes such increased transmission capacity is known. In wavelength division multiplexing, a plurality of optical signals with different wavelengths are simultaneously transmitted using a signal optical fiber.

An optical communication module used for wavelength division multiplexing is an optical transceiver. An optical transceiver used for wavelength division multiplexing includes at least a plurality of light sources that emit light beams (optical signals) with different wavelengths, a lens that condenses and collimates signals emitted from the light sources, and a multiplexing optical system that multiplexes optical signals condensed or collimated by the lens, and semiconductor lasers are used as the light sources in many cases.

In a known optical transceiver, a semiconductor laser serving as a light source, and a light condensing lens and a collimate lens (which will be hereinafter generally referred to as "lenses") are mounted on a common supporting member.

When a semiconductor laser and a lens are mounted on the supporting member, position adjustment of the semiconductor laser and the lens is performed. Specifically, the relative positions of the semiconductor laser and the lens are fine-tuned such that the optical axis of an optical signal emitted from the semiconductor laser and the optical axis of the lens match one another. Conventionally, after the semiconductor laser is mounted on the mounting surface of the supporting member, the above-described alignment operation is performed by moving the lens in two axial directions or three axial directions (see Japanese Unexamined Patent Application Publication No. 2013-80900). In the following description, a direction which is parallel to the mounting surface of the supporting member and is orthogonal to the lens optical axis is defined as "the X-axis direction". A direction which is parallel to the mounting surface of the supporting member and is also parallel to the lens optical axis is defined as "the Z-axis direction". Furthermore, a direction which is perpendicular to the mounting surface of the supporting member and is orthogonal to the lens optical axis is defined as "the Y-axis direction".

SUMMARY OF THE INVENTION

When the semiconductor laser and the lens are mounted on a mounting surface of a common supporting member, alignment of the semiconductor laser and the lens in the X-axis direction or the Z-axis direction can be performed using the mounting surface as a reference surface. That is, the lens is moved in the X-axis direction or the Z-axis direction on the mounting surface, and thereby, alignment in the corresponding direction can be performed. On the other hand, in alignment of the semiconductor laser and the lens in the Y-axis direction, there is no reference surface.

Regarding this point, Japanese Unexamined Patent Application Publication No. 2013-80900 describes a alignment method in which a lens ("a lens part 16" in Japanese Unexamined Patent Application Publication No. 2013-80900) is grasped by a grasper means, such as a collet and the like, such that the lens is held at an optimal position and is thus fixed. That is, the alignment method described in Japanese Unexamined Patent Application Publication No. 2013-80900, when the semiconductor laser and the lens are aligned relative to the Y-axis direction, the lens is held in a state where the lens is floating from the mounting surface.

Alignment in two axial directions, that is, the X-axis direction and the Y-axis direction, which are orthogonal to the lens optical axis is required to be performed with higher accuracy, as compared to alignment in a direction, that is, the Z-axis direction, which is parallel to the lens optical axis. However, in the alignment method described in Japanese Unexamined Patent Application Publication No. 2013-80900, alignment in the Y-axis direction which is required to be performed with higher accuracy, as compared to alignment in the Z-axis direction, has to be performed without a reference surface, and thus, it is not always easy to realize alignment with high accuracy.

It is therefore an object of the present invention to realize simple and highly accurate alignment of a semiconductor laser serving as a light source of an optical communication module and a lens which an optical signal emitted from the semiconductor laser enters.

An optical communication module according to the present invention is an optical communication module that outputs a multiplexed optical signal. An optical communication module according to the present invention includes a plurality of semiconductor lasers that emit optical signals with different wavelengths, a plurality of first supporting members each including a first mounting surface on which a corresponding one of the semiconductor lasers is mounted and a first side surface that intersects with the first mounting surface, and a second supporting member including a second mounting surface on which a lens part that collimates an optical signal emitted from a corresponding one of the plurality of semiconductor lasers and a multiplexing optical system that multiplexes the plurality of optical signals that have been collimated by the lens part are mounted and a second side surface that intersects with the second mounting surface. Each of the first supporting members is fixed to the second supporting member in a state where a corresponding one of the semiconductor lasers mounted thereon is aligned with the lens part and the first side surface abuts the second side surface.

According to one embodiment of the present invention, each of the first supporting members is fixed to the second supporting member by laser welding.

According to another embodiment of the present invention, the lens part is a lens array including a plurality of lens elements each being configured to collimate a corresponding one of the optical signals emitted from the plurality of semiconductor lasers.

A production method according to the present invention is a method for producing an optical communication module for outputting a multiplexed optical signal. In a production method according to the present invention, each of a plurality of semiconductor lasers that emit optical signals with different wavelengths is mounted on a first mounting surface of a corresponding one of a plurality of first supporting members. A lens part that collimates an optical signal emitted from a corresponding one of the plurality of semiconductor lasers and a multiplexing optical system that multiplexes the plurality of optical signals that have been collimated by the lens part are mounted on a second mounting surface of a second supporting member. A first side surface of each of the first supporting members is made to abut a second side surface of the second supporting member. Each of the first supporting members is moved on the second side and thereby a corresponding one of the semiconductor lasers mounted on the first supporting member is aligned with the lens part. Each of the first supporting members is fixed to the second supporting member.

According to one embodiment of the present invention, each of the first supporting members is fixed to the second supporting member by laser welding.

According to another embodiment of the present invention, the lens part is a lens array including a plurality of lens elements each being configured to collimate a corresponding one of the optical signals emitted from the plurality of semiconductor lasers. In this embodiment, each of the first supporting members is moved on the second side surface and thereby a corresponding one of the semiconductor lasers mounted on the first supporting member is aligned with one of the lens elements corresponding to the semiconductor laser.

According to the present invention, a semiconductor laser serving as a light source of an optical communication module and a lens which an optical signal emitted from the semiconductor laser enters can be aligned with high accuracy in a simple manner.

DESCRIPTION OF THE PREFERRED EMBODIMENTS

An example optical communication module to which the present invention is applied will be described in detail with reference to the accompanying drawings. The optical communication module described below is a WDM optical transceiver that complies with the QSFP+ (Quad Small Form-Factor Pluggable Plus) standard, and outputs a multiplex optical signal obtained by multiplexing a plurality of optical signals which have different wavelengths.

Figure 1:
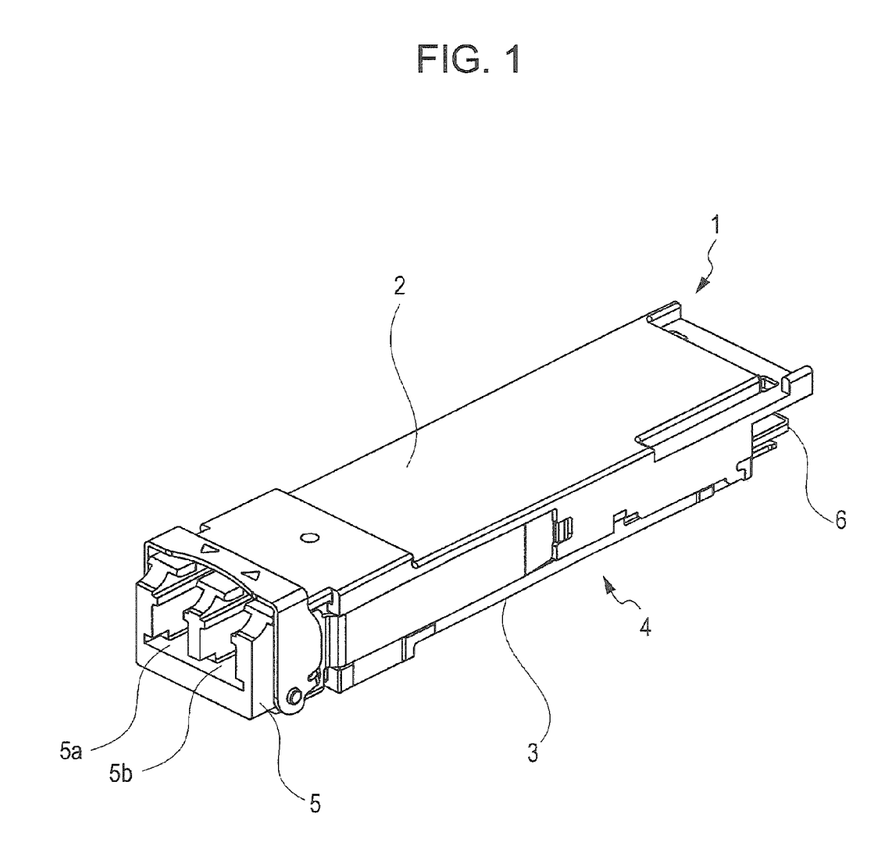
FIG. 1 is a perspective view illustrating an external appearance of an optical transceiver.

As illustrated in FIG. 1, an optical transceiver 1 according to this embodiment includes a module case 4 including an upper case 2 and a lower case 3. The module case 4 has a rectangular parallelepiped exterior appearance as a whole and dimensions that comply with the QSFP+ standard. An optical adaptor 5 is provided at one end of the module case 4 in the longitudinal direction of the module case 4, and a card edge 6 is provided at the other end of the module case 4 in the longitudinal direction. Note that there are cases where the card edge is called an "edge connecter". In the following description, there are cases where one of the end portions of the module case 4 in the longitudinal direction thereof in which the optical adaptor 5 is provided is called a "front side" and the other one thereof in which the card edge 6 is provided is called a "rear side". That is, the optical adaptor 5 is provided at the front side of the module case 4, and the card edge 6 is provided on the rear side of the module case 4.

In the optical adaptor 5, two insertion ports 5a and 5b, into which an optical connector attached to one end of an optical fiber (not illustrated), are provided. One of the insertion ports 5a and 5b, that is, the insertion port 5a is a transmission (TX) insertion port and the other one thereof, that is, the insertion port 5b, is a reception (RX) insertion port. When the card edge 6 is inserted in a slot of a network device (a router, a server, or the like), which is not illustrated, the optical transceiver 1 and the network device are connected to each other. The optical transceiver 1 converts an electrical signal that has been input from the connected network device to an optical signal and outputs the converted signal to an optical fiber cable connected to the transmission insertion port 5a, and converts an optical signal that has been input from an optical fiber cable connected to the reception insertion port 5b to an electric signal and outputs the converted signal to the network device.

Figure 2:
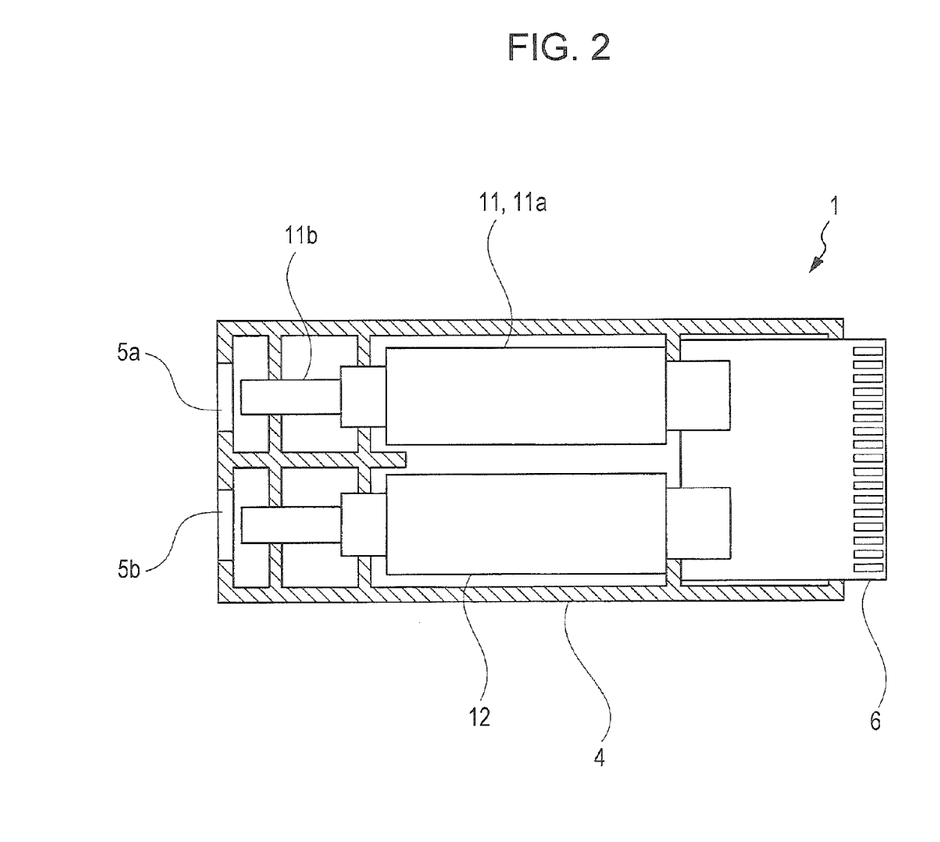
FIG. 2 is a cross-sectional view illustrating an inner structure of the optical transceiver.

As illustrated in FIG. 2, a transmitter optical sub-assembly (TOSA) 11 and a receiver optical sub-assembly (ROSA) 12 that realize the above-described photoelectric conversion are accommodated in the module case 4.

Figure 3:
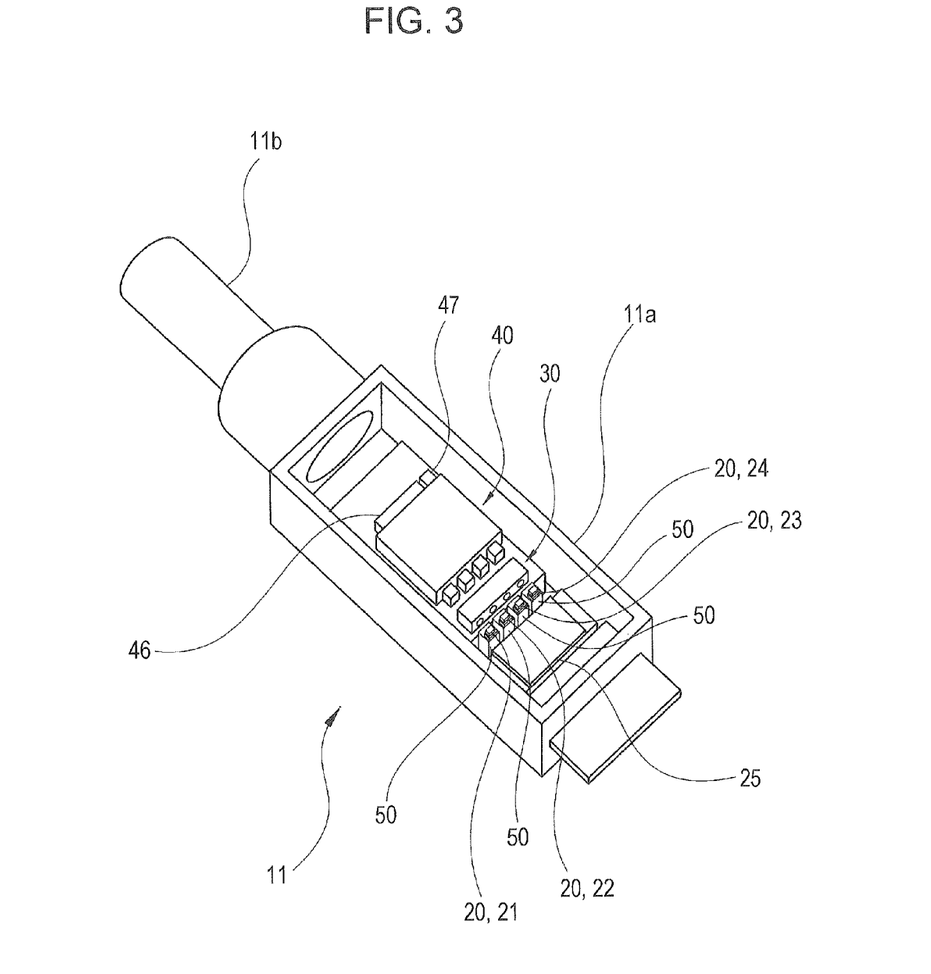
FIG. 3 is a cross-sectional view illustrating an inner structure of a transmitter optical sub-assembly.

As illustrated in FIG. 3, the transmitter optical sub-assembly 11 includes a package 11a and a plurality of semiconductor lasers 20 accommodated in the package 11a. Specifically, the transmitter optical sub-assembly 11 includes a first semiconductor laser 21, a second semiconductor laser 22, a third semiconductor laser 23, and a fourth semiconductor laser 24. The first semiconductor laser 21, the second semiconductor laser 22, the third semiconductor laser 23, and the fourth semiconductor laser 24 are connected to a laser driver 25 via a bonding wire (not illustrated).

Furthermore, the transmitter optical sub-assembly 11 includes a lens part 30 that collimates signals emitted from the first semiconductor laser 21, the second semiconductor laser 22, the third semiconductor laser 23, and the fourth semiconductor laser 24, and a multiplexing optical system 40 that multiplexes the plurality of optical signals that have been collimated by the lens part 30. In the following description, there are cases where the first semiconductor laser 21, the second semiconductor laser 22, the third semiconductor laser 23, and the fourth semiconductor laser 24 are generally referred to as "semiconductor lasers 20".

The first to fourth semiconductor lasers 21-24 are edge emitting lasers (EELs) and are mounted in the form of a bare chip that is not packaged. The semiconductor lasers 20 are mounted in the form of a bare chip in order to reduce the array pitch of the semiconductor lasers 20 to thus realize a reduction in the size of the transmitter optical sub-assembly 11, and furthermore, to realize a reduction in the size of the optical transceiver 1. In the following description, there are cases where an optical signal emitted from the first semiconductor laser 21 is called a "first optical signal", an optical signal emitted from the second semiconductor laser 22 is called a "second optical signal", an optical signal emitted from the third semiconductor laser 23 is called a "third optical signal", and an optical signal emitted from the fourth semiconductor laser 24 is called a "fourth optical signal". There are cases where the first to fourth optical signals are generally referred to as "optical signals".

Figure 4:
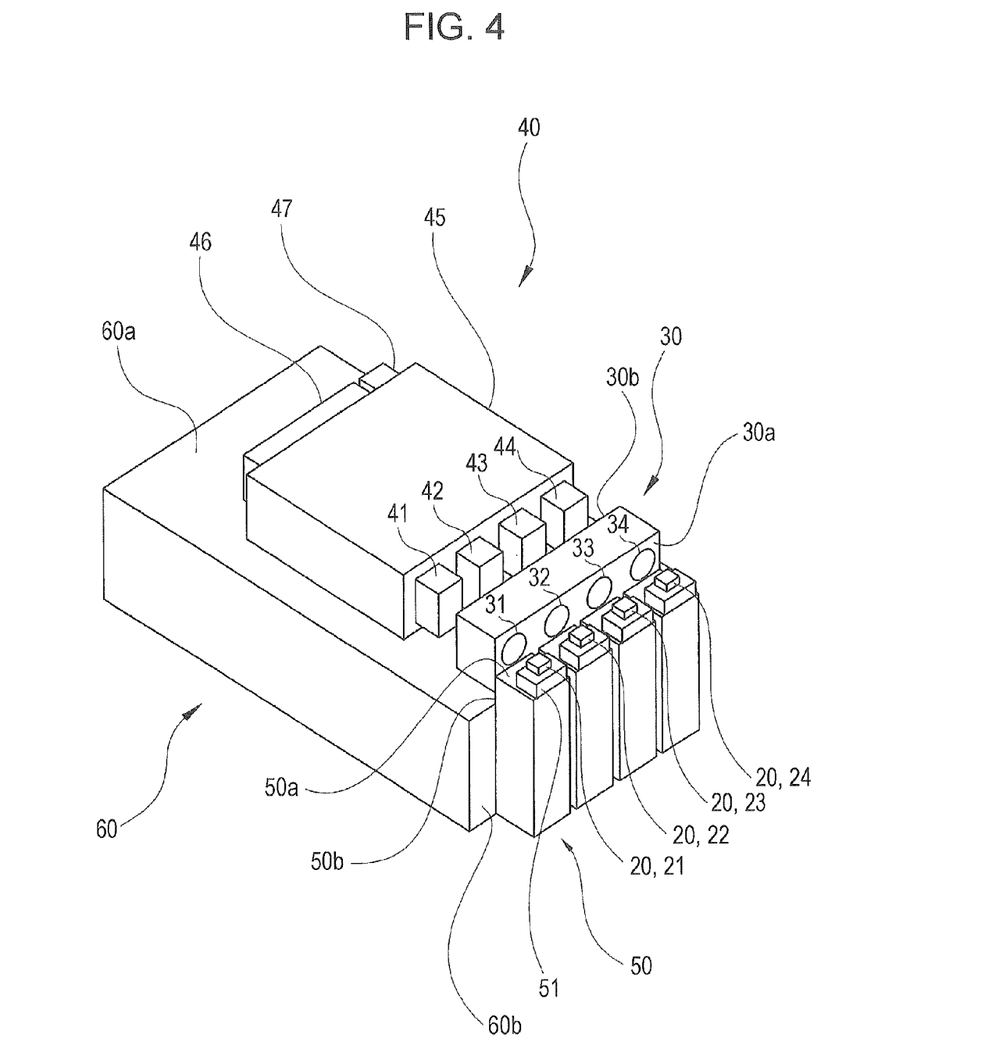
FIG. 4 is an enlarged perspective view illustrating semiconductor lasers mounted on a first supporting member and a lens array and a multiplexing optical system mounted on a second supporting member.

As illustrated in FIG. 4, each of the semiconductor lasers 20 is mounted on a first mount 50 serving as a first supporting member via a sub-mount 51. Each of the first mounts 50 is a metal block having a quadrangular prism shape. The semiconductor laser 20 is mounted on one end surface (an upper end surface 50a) of the first mount 50 in the longitudinal direction via the sub-mount 51. That is, the upper end surface 50a of the first mount 50 is a first mounting surface on which the semiconductor laser 20 is mounted. The sub-mount 51 in this embodiment is made of a ceramic.

As illustrated in FIG. 4, the first semiconductor laser 21, the second semiconductor laser 22, the third semiconductor laser 23, and the fourth semiconductor laser 24 are arranged linearly in this order. The oscillation wavelength (the center wavelength) of the first semiconductor laser 21 is $\lambda 1$ nm, the oscillation wavelength (the center wavelength) of the second semiconductor laser 22 is $\lambda 2$ nm, the oscillation wavelength (the center wavelength) of the third semiconductor laser 23 is $\lambda 3$ nm, and the oscillation wavelength (the center wavelength) of the fourth semiconductor laser 24 is $\lambda 4$ nm. In other words, the wavelength of the first optical signal is $\lambda 1$ nm, the wavelength of the second optical signal is $\lambda 2$ nm, the wavelength of the third optical signal is $\lambda 3$ nm, and the wavelength of the fourth optical signal is $\lambda 4$ nm. The magnitude relationship of these wavelengths is $\lambda 1 < \lambda 2 < \lambda 3 < \lambda 4$. Also, the wavelength interval of each optical signal is 20 nm.

As illustrated in FIG. 4, the lens part 30 and the multiplexing optical system 40 are mounted on a second mount 60 serving as a second supporting member. The second mount 60 is a metal block that is separate from the first mount 50, and has a flatter shape than the first mount 50.

The lens part 30 and the multiplexing optical system 40 are mounted on a surface (an upper surface 60a) of the second mount 60 which is parallel to a first mounting surface 50a. That is, the upper surface 60a of the second mount 60 is a second mounting surface on which the lens part 30 and the multiplexing optical system 40 are mounted.

The lens part 30 is a lens array including a light incident surface 30a which an optical signal emitted from each of the semiconductor lasers 20 enters, and a light emission surface 30b which faces the light incident surface 30a and from which a collimated optical signal is emitted. A plurality of lens elements corresponding to the semiconductor lasers 20 are formed in the light incident surface 30a of the lens array 30. Specifically, a first lens element 31 corresponding to the first semiconductor laser 21, a second lens element 32 corresponding to the second semiconductor laser 22, a third lens element 33 corresponding to the third semiconductor laser 23, and a fourth lens element 34 corresponding to the fourth semiconductor laser 24 are formed in the lens array 30.

Each of the semiconductor lasers 20 and the lens array 30 are aligned. Specifically, each of the semiconductor lasers 20 and a corresponding one of the lens elements are aligned. More specifically, the first semiconductor laser 21 and the first lens element 31 are aligned such that the optical axis of the first optical signal emitted from the first semiconductor laser 21 and the optical axis of the first lens element 31 match one another. The second semiconductor laser 22 and the second lens element 32 are aligned such that the optical axis of the second optical signal emitted from the second semiconductor laser 22 and the optical axis of the second lens element 32 match one another. The third semiconductor laser 23 and the third lens element 33 are aligned such that the optical axis of the third optical signal emitted from the third semiconductor laser 23 and the optical axis of the third lens element 33 match one another. The fourth semiconductor laser 24 and the fourth lens element 34 are aligned such that the optical axis of the fourth optical signal emitted from the fourth semiconductor laser 24 and the optical axis of the fourth lens element 34 match one another. Note that a method for aligning the semiconductor lasers 20 and the lens array 30 (the lens elements) will be described later.

The multiplexing optical system 40 includes an antireflective (AR) filter 41, bandpass filters 42, 43, and 44, a glass substrate 45 having a rectangular parallelepiped shape, a reflection mirror 46, and an antireflective (AR) filter 47. The AR filter 41 and the bandpass filters 42, 43, and 44 are provided on one surface of the glass substrate 45 which faces the light emission surface 30b of the lens array 30. The reflection mirror 46 and the AR filter 47 are provided on the other surface of the glass substrate 45 which is located on the opposite side to the surface on which the AR filter 41 and the bandpass filters 42, 43, and 44 are provided.

Figure 5:
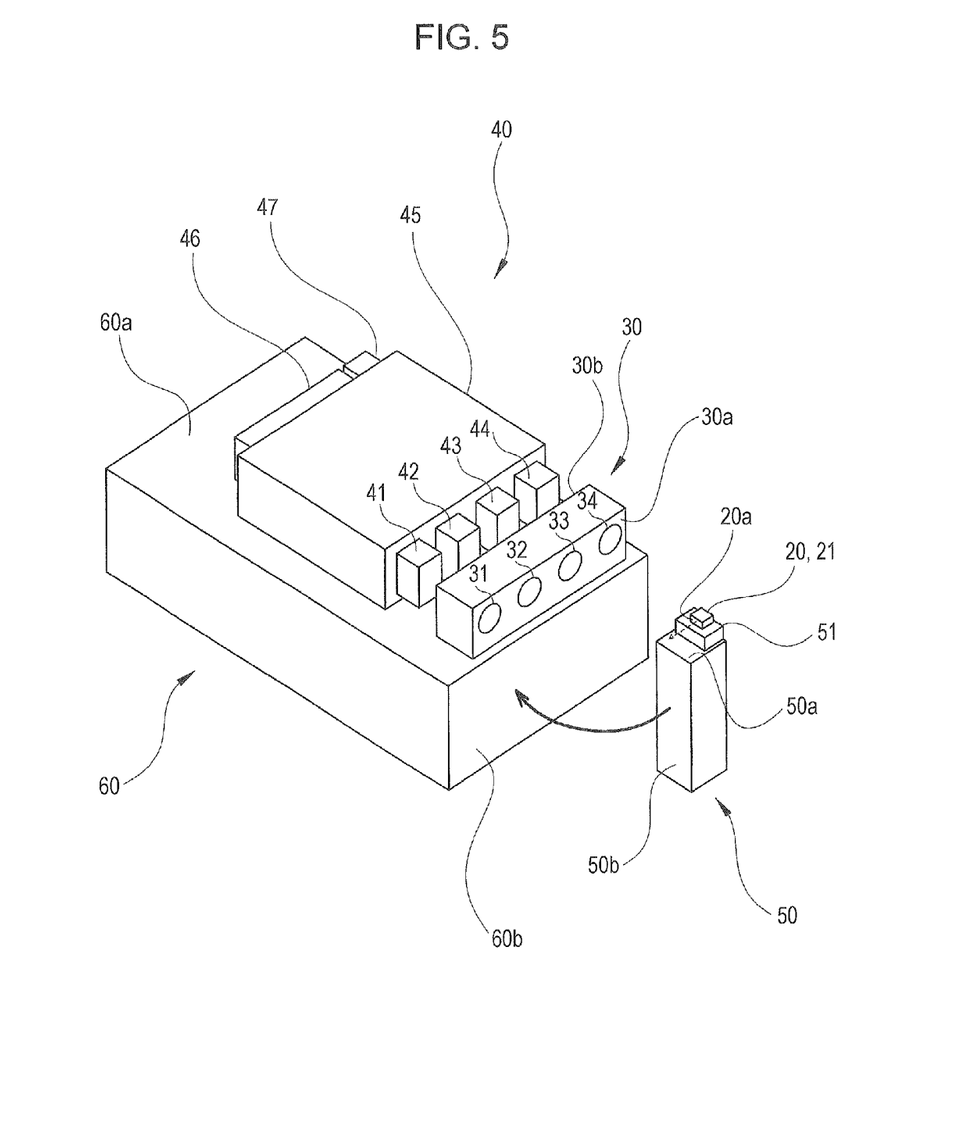
FIG. 5 is an enlarged perspective view illustrating a first side surface of a first supporting member and a second side surface of a second supporting member.

As illustrated in FIG. 5, each of the first mounts 50 has a first side surface 50b that intersects the first mounting surface 50a on which a corresponding one of the semiconductor lasers 20 is mounted. On the other hand, the second mount 60 has a second side surface 60b that intersects a second mounting surface 60a on which the lens part 30 and the multiplexing optical system 40 are mounted. In this embodiment, the first side surface 50b of the first mount 50 is parallel to a light emission surface 20a of a corresponding one of the semiconductor lasers 20 mounted on the first mounting surfaces 50a and is orthogonal to the first mounting surfaces 50a. Also, the second side surface 60b of the second mount 60 is parallel to the light incident surface 30a of the lens array 30 mounted on the second mounting surface 60a and is orthogonal to the second mounting surface 60a.

The first mount 50 is fixed to the second mount 60 in a state where the first side surface 50b abuts the second side surface 60b. Specifically, the first side surface 50b of the first mount 50 is laser welded (YAG laser welded in this embodiment) to the second side surface 60b of the second mount 60. That is, the semiconductor lasers 20 and the lens part 30 are mounted on different supporting members.

FIG. 4 will be referred to again. The AR filter 41 and the three bandpass filters 42, 43, and 44 are arranged linearly along the array direction of the semiconductor lasers 20. The AR filter 41 corresponds to the first semiconductor laser 21, and the first optical signal emitted from the first semiconductor laser 21 and collimated by the first lens element 31 enters the AR filter 41. The bandpass filter 42 corresponds to the second semiconductor laser 22, and the second optical signal emitted from the second semiconductor laser 22 and collimated by the second lens element 32 enters the bandpass filter 42. The bandpass filter 43 corresponds to the third semiconductor laser 23, and the third optical signal emitted from the third semiconductor laser 23 and collimated by the third lens element 33 enters the bandpass filter 43. The bandpass filter 44 corresponds to the fourth semiconductor laser 24, and the fourth optical signal emitted from the fourth semiconductor laser 24 and collimated by the fourth lens element 34 enters the bandpass filter 44.

The AR filter 41 is a so-called non-reflection coat and transmits the first optical signal with low loss. The bandpass filters have different pass bands. Specifically, the bandpass filter 42 reflects at least the first optical signal and transmits the second optical signal. The bandpass filter 43 reflects at least the first optical signal and the second optical signal and transmits the third optical signal. The bandpass filter 44 blocks at least the first optical signal, the second optical signal, and the third optical signal and transmits the fourth optical signal. On the other hand, the reflection mirror 46 is a so-called total reflection mirror and blocks at least the first optical signal, the second optical signal, and the third optical signal.

The AR filter 47 is a so-called non-reflection coat and transmits the first optical signal, the second optical signal, the third optical signal, and the fourth optical signal with low loss. That is, a multiplex optical signal obtained by performing wavelength division multiplexing on the first optical signal, the second optical signal, the third optical signal, and the fourth optical signal is emitted through the AR filter 47. The multiplex optical signal emitted through the AR filter 47 enters a light condensing lens (not illustrated) provided between the package 11a and a receptacle 11b illustrated in FIG. 2 and FIG. 3, and is condensed to a ferrule (not illustrated) in the receptacle 11b by the light condensing lens. Note that there are cases where a prism, or the like, which transforms an optical path of the multiplex optical signal emitted from the multiplexing optical system 40 is provided between the AR filter 47 (the multiplexing optical system 40) illustrated in FIG. 3 and the light condensing lens. Also, there are cases where an isolator is provided between the AR filter 47 (the multiplexing optical system 40) and the light condensing lens.

Next, an example method for producing the optical transceiver 1 according to this embodiment will be described. Steps of mounting the semiconductor lasers 20 and the lens array 30 illustrated in FIG. 4 will be mainly described herein, and other steps will be omitted.

First, necessary members are prepared. Specifically, the first semiconductor laser 21, the second semiconductor laser 22, the third semiconductor laser 23, and the fourth semiconductor laser 24 illustrated in FIG. 4 are prepared (a semiconductor laser preparation step). Four first mounts 50 are prepared (a first mount preparation step). Furthermore, the lens part 30 and the multiplexing optical system 40 are prepared (an optical system preparation step). In addition, the second mount 60 is prepared (a second mount preparation step).

Figure 6:
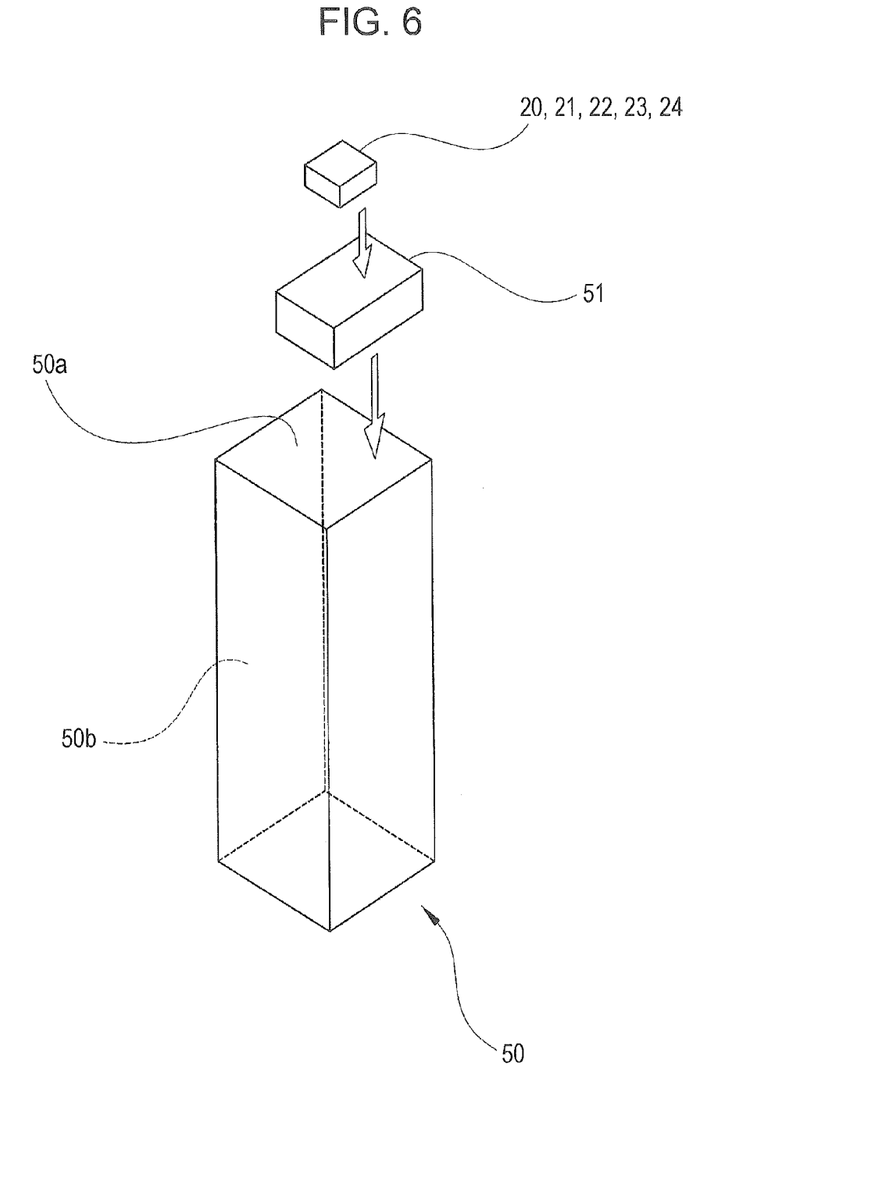
FIG. 6 is an explanatory view illustrating a step of mounting the semiconductor lasers on the first supporting member.

Next, each of the semiconductor lasers 20 is mounted on a corresponding one of the first mounts 50 (a semiconductor laser mounting step). Specifically, as illustrated in FIG. 6, the sub-mount 51 is mounted on a part of the first mounting surface 50a of the first mount 50 located at a predetermined position and the semiconductor laser 20 is mounted on a part of the sub-mount 51 located at a predetermined position. As another option, the sub-mount 51, on which the semiconductor laser 20 was previously mounted, is mounted on a part of the first mounting surface 50a of the first mount 50 located at a predetermined position.

Figure 7:
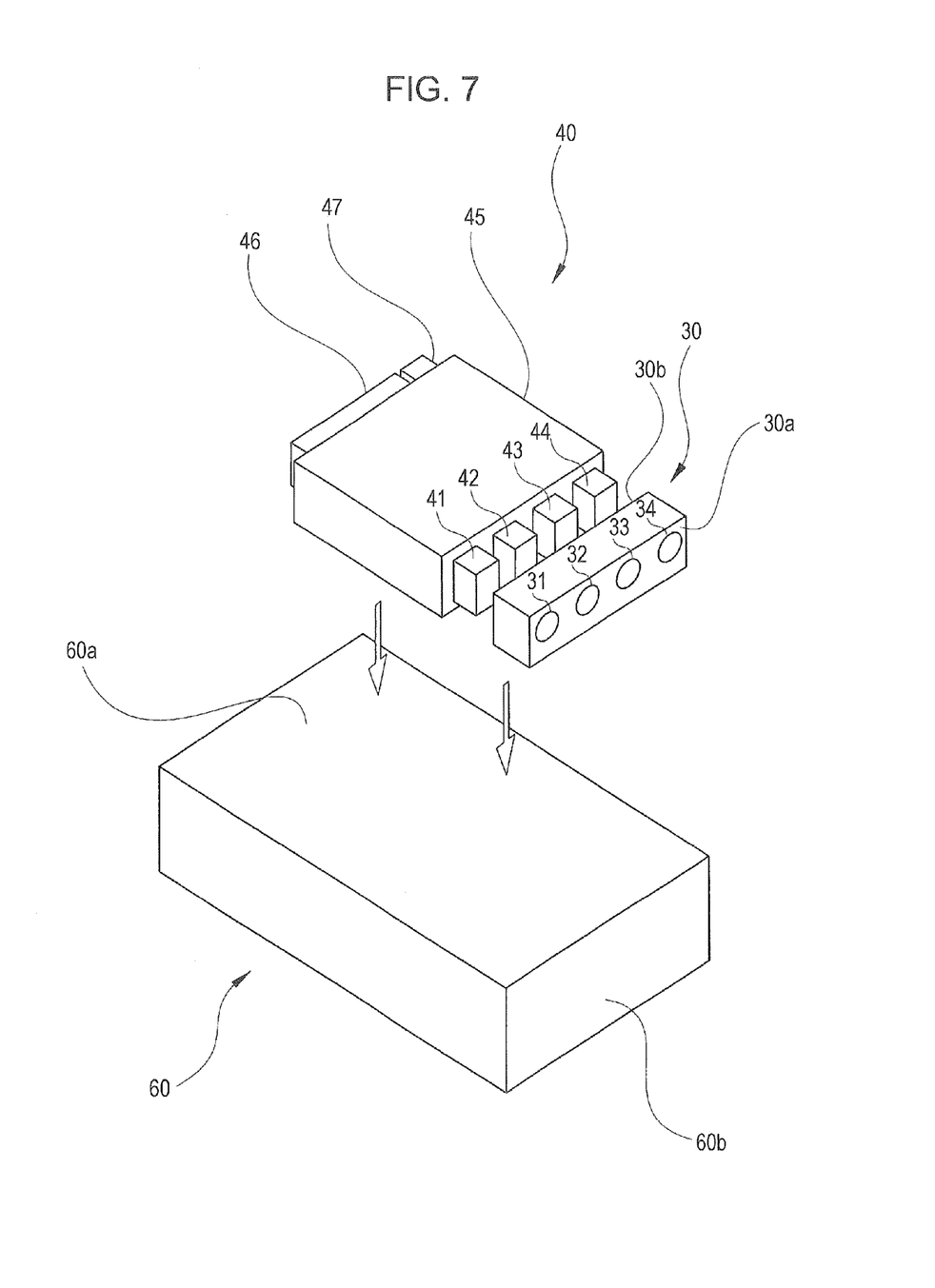
FIG. 7 is an explanatory view illustrating a step of mounting the lens array and the multiplexing optical system on the second supporting member.

Next, the lens array 30 and the multiplexing optical system 40 are mounted on the second mount 60 (an optical system mounting step). Specifically, as illustrated in FIG. 7, the lens array 30 and the multiplexing optical system 40 are mounted on a part of the second mounting surface 60a of the second mount 60 located at a predetermined position. As for the multiplexing optical system 40, the glass substrate 45 on which the AR filter 41, the bandpass filters 42, 43, and 44, the reflection mirror 46, and the AR filter 47 are provided is mounted on the second mounting surface 60a. Note that either one of the semiconductor laser mounting step or the optical system mounting step may be executed first.

Figure 8:
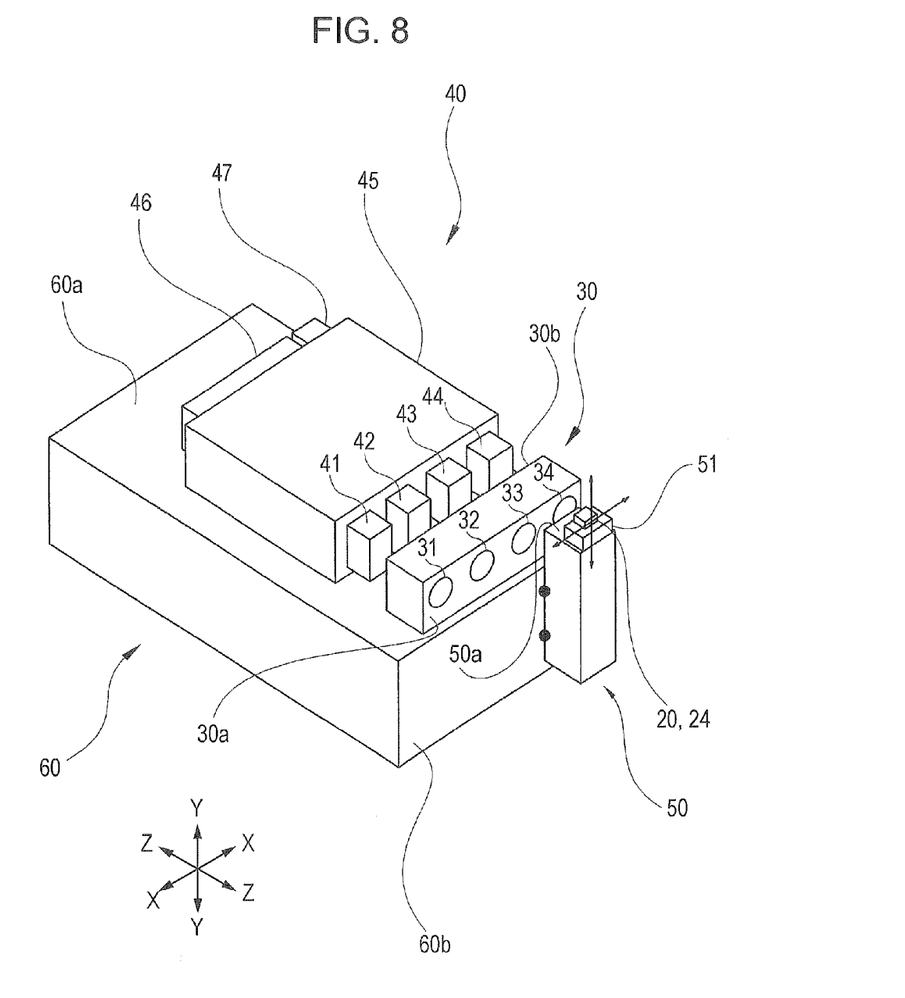
FIG. 8 is an explanatory view illustrating a step of aligning the semiconductor lasers and the lens array with one another.

Next, as illustrated in FIG. 8, after the fourth semiconductor laser 24 and the fourth lens element 34 are aligned, one of the first mounts 50 on which the fourth semiconductor laser 24 is mounted is fixed to the second mount 60. Specifically, the first side surface 50b (FIG. 6) of the first mount 50, on which the fourth semiconductor laser 24 is mounted, is made to abut the second side surface 60b of the second mount 60. Thereafter, the first mount 50 is moved up and down and left and right (in the X-axis direction and the Y-axis direction) on the second side surface 60b of the second mount 60, and the optical axis of light (which does not necessarily have to be an optical signal) emitted from the fourth semiconductor laser 24 is made to match the optical axis of the fourth lens element 34. In other words, the first mount 50 is moved in the X-axis direction and the Y-axis direction in a plane parallel to the second side surface 60b of the second mount 60, thereby aligning the fourth semiconductor laser 24 with the fourth lens element 34. For example, light emitted from the AR filter 47 is monitored by a camera, a power meter, or the like, and the first mount 50 is moved to determine the position of the first mount 50. When the position of the first mount 50 is determined, the first mount 50 is fixed in the position by performing YAG laser welding.

Next, the second mount 60 to which the first mount 50, on which the fourth semiconductor laser 24 is mounted, is fixed is accommodated in the package 11a (FIG. 3). Thereafter, the position of the light condensing lens (not illustrated) provided between the package 11a and the receptacle 11b and the position of the receptacle 11b are adjusted such that an output of light emitted from the ferrule (not illustrated) in the receptacle 11b illustrated in FIG. 3 is maximum, and the light condensing lens and the receptacle 11b are fixed to the package 11a.

Next, the rest of the first mounts 50 are fixed to the second mount 60 by performing YAG laser welding. Specifically, after the third semiconductor laser 23 and the third lens element 33 (FIG. 4) are aligned such that an output of light emitted from the ferrule (not illustrated) in the receptacle 11b illustrated in FIG. 3 is maximum, the first mount 50 on which the third semiconductor laser 23 is mounted is fixed to the second mount 60. Note that the method for aligning the third semiconductor laser 23 and the third lens element 33 (FIG. 4) is the same as the method (FIG. 8) for aligning the fourth semiconductor laser 24 and the fourth lens element 34. Similarly, the first mount 50 on which the second semiconductor laser 22 is mounted is fixed to the second mount 60, and thereafter, the first mount 50 on which the first semiconductor laser 21 is mounted is fixed to the second mount 60. The first mounts 50 are fixed to the second mount 60 in this order in order to avoid a situation where a surface which is to be irradiated with a YAG laser is covered. Therefore, a surface which is to be irradiated with a YAG laser may be changed and the order in which the first mounts 50 are fixed to the second mount 60 may be changed to a different order from that described above.

As described above, in the production method according to this embodiment, the semiconductor lasers 20 mounted on the first mounts 50 as separated bodies from the second mount 60 on which the lens array 30 is mounted are moved in the X-axis direction or/and the Y-axis direction, and thus, the semiconductor lasers 20 and the lens array 30 are position-adjusted (aligned). Furthermore, when the semiconductor lasers 20 are moved in the X-axis direction or/and the Y-axis direction, the second side surface 60b of the second mount 60 is a reference surface. Thus, alignment in the X-axis direction and the Y-axis direction requires higher accuracy, as compared to that in the Z-axis direction, can be reliably performed in a simple manner. In the optical transceiver 1 produced by the production method according to this embodiment, the semiconductor lasers 20 and the lens array 30 are aligned in the X-axis direction and the Y-axis direction with high accuracy.

The present disclosure is not limited to the above-described embodiment and various modifications may be made without deviating from the scope and gist of the invention. For example, the number of semiconductor lasers serving as light sources may be three or less or five or more. That is, the number of optical signals that are wavelength division multiplexed may be three or less or five or more.

A semiconductor laser is not limited to an edge emitting laser and may be a surface emitting laser (SEL), such as a vertical cavity surface emitting laser (VCSEL) or the like.

The quality of the material of each of a first mount serving as a first supporting member and a second mount serving as a second supporting member may be changed, as appropriate. The quality of the material of a sub-mount provided between a semiconductor laser and the first mount may also be changed, as appropriate. For example, when importance is placed on radiation performance rather than insulation performance, a sub-mount made of metal can be used, instead of a sub-mount made of a ceramic. When insulation performance is needed, a sub-mount made of a dielectric material can be used, instead of a sub-mount made of a ceramic. Furthermore, a semiconductor laser may be directly mounted on a first mounting surface of the first mount without a sub-mount interposed therebetween.

A lens part is not limited to a lens array. Instead of the lens array in the above-described embodiment, a plurality of independent collimate lenses may be used. In view of reduction in production cost, a lens array is preferably used.

The method for fixing the first supporting member and the second supporting member is not limited to YAG laser welding. For example, the first supporting member may be fixed to the second mount by a welding method other than laser welding, and the first supporting member may be fixed to the second supporting member by adhesive bonding or soldering. Similarly, the method for fixing a receptacle and a lens is not limited to YAG laser welding.

The present invention is applicable to an optical communication module other than an optical transceiver.

What is claimed is:

1. An optical communication module circuit for outputting a multiplexed signal, the optical communication module comprising:
a plurality of semiconductor lasers that emit optical signals with different wavelengths;
a plurality of first supporting members each including a first mounting surface on which a corresponding one of the semiconductor lasers is mounted and a first side surface that intersects the first mounting surface; and
a second supporting member including a second mounting surface on which a lens part that collimates an optical signal emitted from a corresponding one of the plurality of semiconductor lasers and a multiplexing optical system that multiplexes the plurality of optical signals that have been collimated by the lens part are mounted and a second side surface that intersects with the second mounting surface,
wherein
each of the first supporting members is fixed to the second supporting member in a state where a corresponding one of the semiconductor lasers mounted thereon is aligned with the lens part and the first side surface abuts the second side surface.

2. The optical communication module according to claim 1,
wherein
each of the first supporting members is fixed to the second supporting member by laser welding.

3. The optical communication module according to claim 1,
wherein
the lens part is a lens array including a plurality of lens elements each being configured to collimate a corresponding one of the optical signals emitted from the plurality of semiconductor lasers.

4. A method for producing an optical communication module for outputting a multiplexed optical signal, the method comprising:
mounting each of a plurality of semiconductor lasers that emit optical signals with different wavelengths on a first mounting surface of a corresponding one of a plurality of first supporting members;
mounting a lens part that collimates an optical signal emitted from a corresponding one of the plurality of semiconductor lasers and a multiplexing optical system that multiplexes the plurality of optical signals that have been collimated by the lens part on a second mounting surface of a second supporting member;
making a first side surface of each of the first supporting members abut a second side surface of the second supporting member;
moving each of the first supporting members on the second side surface to align a corresponding one of the semiconductor lasers mounted on the first supporting member with the lens part; and
fixing each of the first supporting members to the second supporting member.

5. The method for producing an optical communication module according to claim 4,
wherein
each of the first supporting members is fixed to the second supporting member by laser welding.

6. The method for producing an optical communication module according to claim 4,
wherein
the lens part is a lens array including a plurality of lens elements each being configured to collimate a corresponding one of the optical signals emitted from the plurality of semiconductor lasers, and
each of the first supporting members is moved on the second side surface and thereby a corresponding one of the semiconductor lasers mounted on the first supporting member is aligned with one of the lens elements corresponding to the semiconductor laser.

* * * * *